(12) United States Patent
Wallace et al.

(10) Patent No.: US 7,725,807 B2
(45) Date of Patent: May 25, 2010

(54) ERROR CHECKING USING A FIELD OF A FRAME

(75) Inventors: Bradley Arthur Wallace, Austin, TX (US); Paul Morris Astrachan, Austin, TX (US)

(73) Assignee: VIXS Systems, Inc., Toronto, Ontario (CA)

( * ) Notice: Subject to any disclaimer, the term of this patent is extended or adjusted under 35 U.S.C. 154(b) by 745 days.

(21) Appl. No.: 11/337,333

(22) Filed: Jan. 23, 2006

(65) Prior Publication Data

US 2007/0174745 A1    Jul. 26, 2007

(51) Int. Cl.
    H03M 13/00    (2006.01)
(52) U.S. Cl. .................. 714/776; 714/777; 714/795; 714/21; 369/30.21
(58) Field of Classification Search .............. 714/776, 714/777, 795, 21; 369/30.21
    See application file for complete search history.

(56) References Cited

U.S. PATENT DOCUMENTS

| | | | | |
|---|---|---|---|---|
| 4,998,253 A | * | 3/1991 | Ohashi et al. ............... | 714/791 |
| 5,214,672 A | * | 5/1993 | Eyuboglu et al. ........... | 375/254 |
| 5,673,291 A | * | 9/1997 | Dent .......................... | 375/262 |
| 6,014,411 A | * | 1/2000 | Wang ......................... | 375/259 |
| 6,097,769 A | * | 8/2000 | Sayiner et al. .............. | 375/341 |
| 6,385,753 B1 | * | 5/2002 | Hatakeyama ............... | 714/796 |
| 6,760,300 B1 | * | 7/2004 | Eberle et al. ................ | 370/210 |
| 6,877,132 B1 | * | 4/2005 | De et al. ..................... | 714/795 |
| 6,958,781 B2 | * | 10/2005 | Fimoff ....................... | 348/555 |
| 6,959,036 B1 | * | 10/2005 | Rezvani et al. ............. | 375/222 |

OTHER PUBLICATIONS

Richard V. Cox and Carl-Erik W. Sundberg, An efficient Adaptive Circular Viterbi Algorithm for decoding Generalized Tailbiting Convolutional Codes, 1994, IEEE, vol. 43, p. 59.*

Richard V. Cox and Carl-Erik W. Sundberg, An efficient Adaptive Circular Viterbi Algorithm for decoding Generalized Tailbiting U Convolutional Codes, 1994, IEEE, vol. 43, p. 58-59.*

* cited by examiner

*Primary Examiner*—Scott T Baderman
*Assistant Examiner*—Enam Ahmed
(74) *Attorney, Agent, or Firm*—Garlick Harrison & Markison; Timothy W. Markison; Holly L. Rudnick

(57) ABSTRACT

A method for field error checking begins by decoding a predetermined pattern of a field of a frame to produce a decoded pattern. The method continues by determining, for the decoded pattern, a path metric distance of a predetermined state of a plurality of states of the decoding. The method continues by comparing the path metric distance with an excepted path metric distance for the predetermined state. The method continues by indicating a field error when the path metric distance compares unfavorably with the excepted path metric distance.

22 Claims, 8 Drawing Sheets radio receiver 10

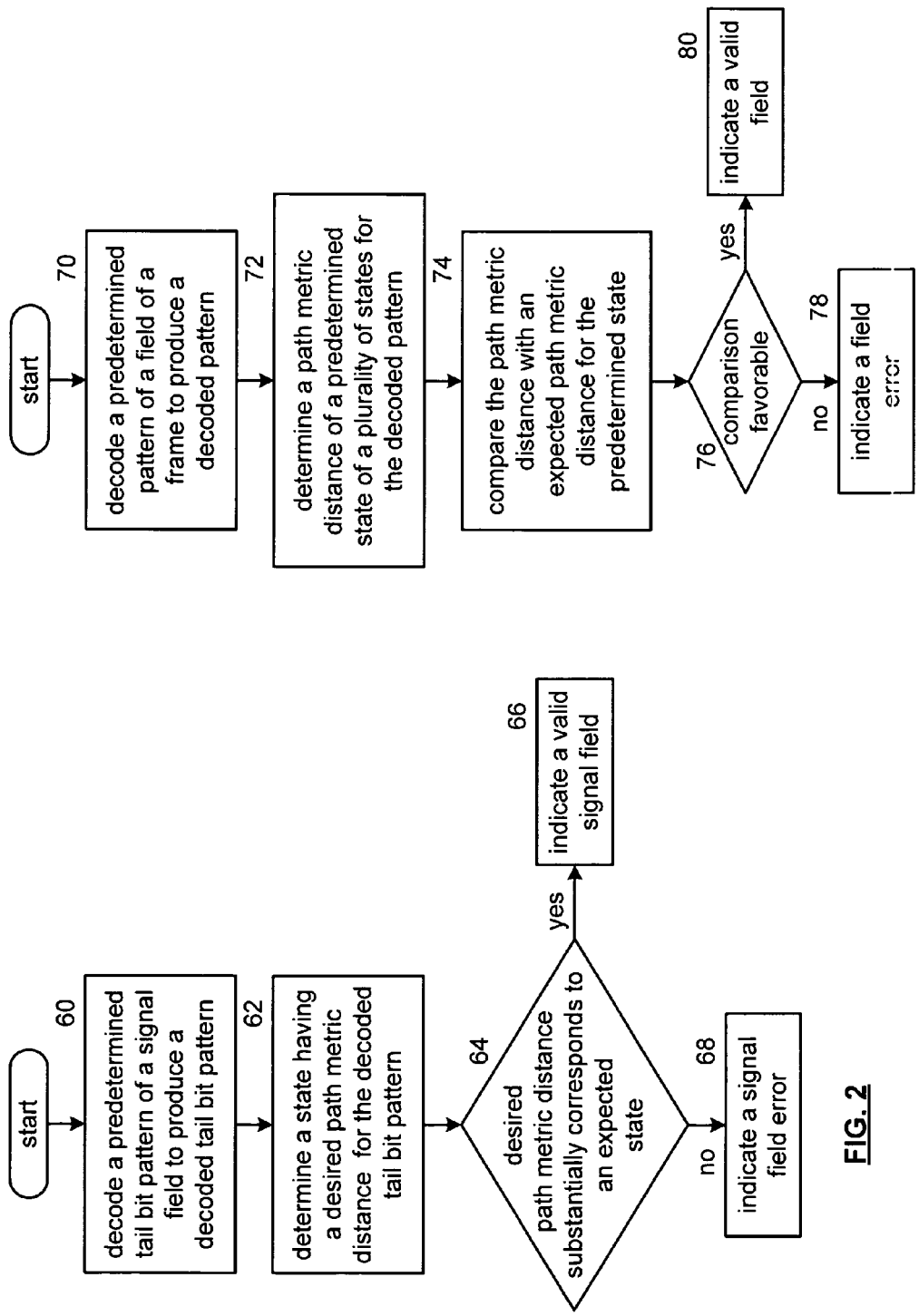

| input (b₁) | current state (S₀, S₁, S₂) | next state (S₀, S₁, S₂) | output (r₀, r₁) |
|---|---|---|---|
| 0 | 000 | 000 | 00 |
| 0 | 001 | 000 | 11 |
| 0 | 010 | 001 | 10 |
| 0 | 011 | 001 | 01 |
| 0 | 100 | 010 | 10 |
| 0 | 101 | 011 | 01 |
| 0 | 110 | 011 | 00 |
| 1 | 111 | 100 | 11 |
| 1 | 000 | 100 | 11 |
| 1 | 001 | 101 | 00 |
| 1 | 010 | 011 | 01 |
| 1 | 011 | 110 | 10 |
| 1 | 100 | 110 | 01 |
| 1 | 101 | 111 | 11 |
| 1 | 110 | 111 | 00 | encoding table example ½ code rate encoder

| time | input (b₁) | current state (S₀, S₁, S₂) | next state (S₀, S₁, S₂) | output (r₀, r₁) |
|---|---|---|---|---|
| $t_0$ | x | 000 | 000 | 00 |
| $t_1$ | 1 | 000 | 100 | 11 |
| $t_2$ | 0 | 100 | 010 | 10 |
| $t_3$ | 1 | 010 | 101 | 01 |
| $t_4$ | 1 | 101 | 110 | 10 |
| $t_5$ | 0 | 110 | 011 | 00 |
| $t_6$ | 0 | 011 | 001 | 01 |
| $t_7$ | 1 | 001 | 100 | 00 |
| $t_8$ | 1 | 100 | 110 | 01 |
| $t_9$ | 1 | 110 | 111 | 11 |
| $t_{10}$ | 1 | 111 | 111 | 00 |
| $t_{11}$ | 0 | 111 | 011 | 11 |
| $t_{12}$ | 0 | 011 | 001 | 01 |
| $t_{13}$ | 0 | 001 | 000 | 11 |
| $t_{14}$ | 0 | 000 | 000 | 00 | example of encoding
1011001110000 state diagram of encoding state diagram of decoding

ERROR CHECKING USING A FIELD OF A FRAME

CROSS REFERENCE TO RELATED PATENTS

NOT APPLICABLE

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to wireless communication and more particularly to wireless communication error checking.

2. Description of the Related Art

As is known, wireless communication devices (e.g., cellular telephones, modems, local area network connections within video systems, etc.) communicate in accordance with one or more wireless communication protocols. One such wireless communication protocol is IEEE 802.11a, which defines a frame format for wireless communication in a wireless local area network (WLAN). As defined, the frame includes a PLCP (Physical Layer Convergence Procedure) preamble, a signal field, and data fields. The signal field is convolutional encoded and includes a rate field, a reserved field, a length field, a parity bit field, and a tail field.

In a wireless communication, the receiving device uses the preamble to acquire and synchronize the incoming frame. Once synchronized, the receiving device uses the signal field to determine information regarding the data fields and to verify, via the parity bit field, that the information of the signal field was received properly. If the parity bit is zero, then it is assumed that the signal field data was received properly and, if the parity bit is one, then it is assumed that the signal field data was not received properly.

The parity bit accurately indicates the validity of the signal field when the signal field (contains no errors or contains an odd number of errors. As is known, a parity check is incremented in a modulo-2 fashion for each error encountered. With only a signal bit parity check, the parity bit is zero when no errors are detected, is one when the first error is detected, is zero when the second error is detected, and so on. Thus, if the signal field includes an even number of errors, the parity check bit will indicate that the signal field is valid, which is incorrect.

Therefore, a need exists for a method and apparatus for improved error checking in a wireless communication frame.

BRIEF DESCRIPTION OF THE SEVERAL VIEWS OF THE DRAWING(S)

FIG. 2 is a logic diagram of a method for signal field error checking in accordance with the present invention;

FIG. 3 is a logic diagram of a method for field error checking in accordance with the present invention;

DETAILED DESCRIPTION OF THE INVENTION

Figure 1:
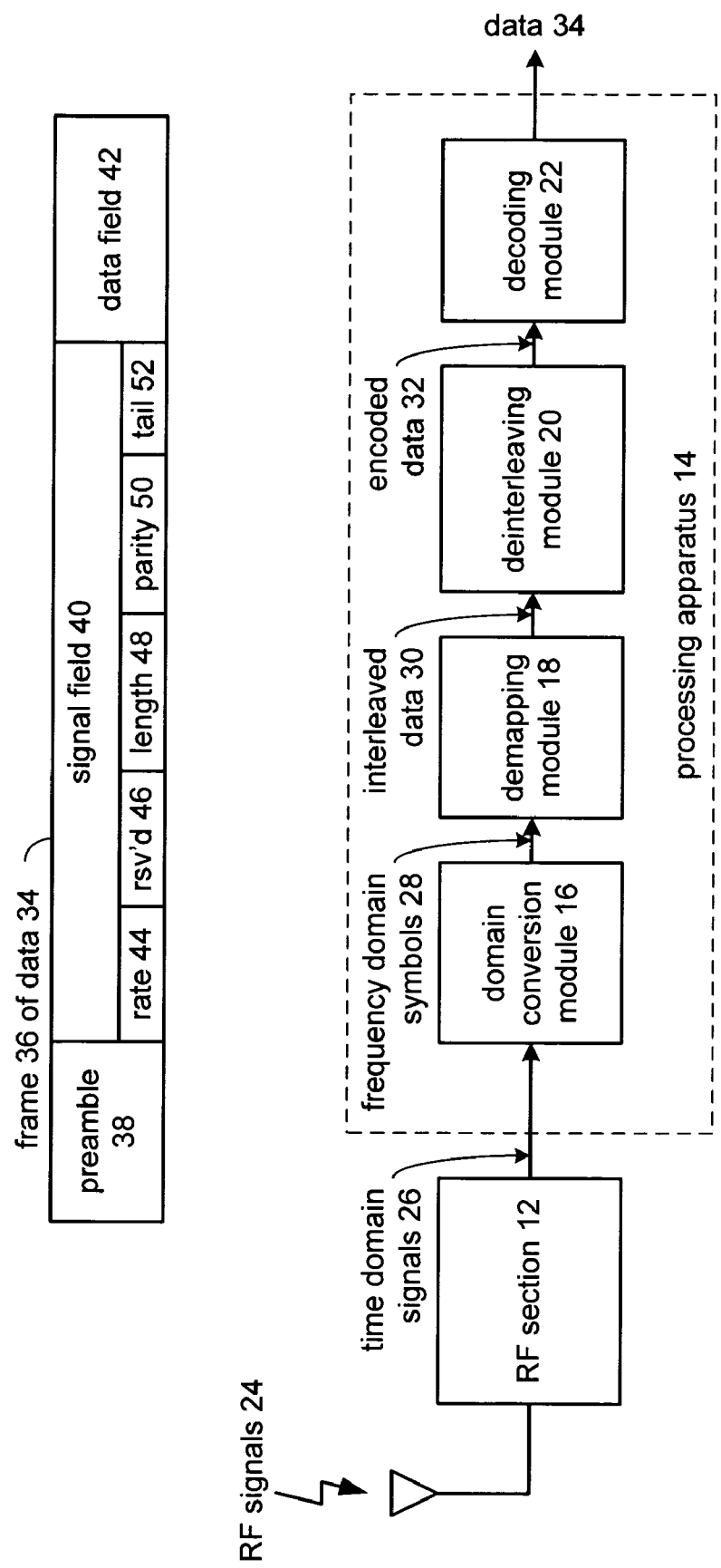
FIG. 1 is a schematic block diagram of a radio receiver in accordance with the present invention.

FIG. 1 is a schematic block diagram of a radio receiver 10 that may be used in a wireless video distribution system and includes an RF section 12 and a processing apparatus 14. The processing apparatus 14, which may be implemented as a processing module, includes a domain conversion module 16, a demapping module 18, a deinterleaving module 20 and a decoding module 22. The processing apparatus 14 may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The process apparatus may be associated with or include a memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing apparatus 14 implements one or more of its functions via a state machine, analog circuitry, digital circuitry, and/or logic circuitry, the memory element storing the corresponding operational instructions may be embedded within, or external to, the circuitry comprising the state machine, analog circuitry, digital circuitry, and/or logic circuitry. Further note that, the memory element stores, and the processing apparatus 14 executes, operational instructions corresponding to at least some of the steps and/o functions illustrated in FIGS. 1-11.

The RF section 12 receives RF signals 24 that may be compliant with one or more wireless communication standards. For example, the RF signals 24 may be in accordance with IEEE802.11a. The RF section 12 converts the RF signals 24 into time domain baseband signals 26. The time domain conversion module 16 converts the time domain signals 26 from the time domain to the frequency domain to produce frequency domain symbols 28. The demapping module 18 converts the frequency domain symbols 28 into interleaved data 30. The deinterleaving module 20 converts the deinterleaved data 30 into encoded data 32. The decoding module 22 converts the encoded data 32 into data 34.

The recaptured data 34 may be in accordance with a wireless communication protocol such as IEEE802.11a. In this instance, the data 34 would include a plurality of frames 36, where each frame includes a preamble 38, a signal field 40, and a data field 42. The signal field may include a rate field 44, a reserved bit field 46, a length field 48, a parity bit field 50 and a tail field 52.

In one embodiment, the decoding module 22, as it is decoding the tail field 52 of signal field 40, monitors the decoding to determine whether the signal field has been accurately received (received without error). If so, the decoding module 22 indicates that the signal field has been accurately received or, if errors are detected, the decoding module 22 indicates that the signal field 40 was not accurately received. The decoding module 22 may follow one or more of the methods illustrated in FIGS. 2 and 3 to detect errors within the signal field 40 and thus indicate the validity of the signal field.

In another embodiment, the decoding module may detect a predetermined bit pattern in any one of the plurality of fields within a frame of transmitted data. For example, the decoding module may monitor the decoding of the tail field 52 of signal field 40.

FIG. 2 is a logic diagram of a method for signal field error checking. The process begins at Step 60 where a predetermined tail bit pattern of a signal field is decoded to produce a decoded tail bit pattern. The decoding may be done in accordance with VITERBI decoding, trellis decoding or convolutional decoding. The process then proceeds to Step 62 where a state having a desired path metric distance for the decoded tail bit pattern is determined. In one embodiment, the tail bit pattern may include a series of sequential logic zeros. In this instance, one of a plurality of states of decoding that has a minimum path metric distance is identified as the state having the desired path metrics. In this instance, the expected state corresponds to an initial state of the plurality of states. As an alternative, the predetermined bit tail pattern may include a series of sequential logic ones. In this instance, one of the plurality of states of the decoding that includes a minimum path metric distance is identified as the state having the desired path metrics. In this instance, the expected state corresponds to a state of the plurality of states having these series of sequential logic ones. Note that the predetermined bit pattern may be of any pattern desired where, with a known bit pattern, the decoding at particular times will identify corresponding states if the decoding is accurately being performed.

The process then proceeds to Step 64 where a determination is made as to whether desired path metric distance substantially corresponds to an expected state, where the expected state is based on the predetermined tail bit pattern. If yes, the process proceeds to Step 64 where the signal field is indicated as being valid. If not, the process proceeds to Step 68 where a signal field error is indicated.

FIG. 3 is a logic diagram of a method for field error checking that begins at Step 70 where a predetermined pattern of a field of a frame is decoded to produce a decoded pattern. The process then proceeds to Step 72 where a path metric distance of a predetermined state of a plurality of states is determined for the decoded pattern. In one embodiment, when the predetermined pattern includes a series of sequential logic zeros such that the determining by utilizing an initial state of the plurality of states as the predetermined state; and determining whether the initial state has a minimum path metric distance with respect to path metric distances of other states of the plurality of states to provide a favorable comparison of the path metric distance with the excepted path metric distance. In another embodiment, when the predetermined pattern includes a series of sequential logic zeros, the determining includes utilizing an initial state of the plurality of states as the predetermined state; determining whether the path metric distance is zero; and then the path metric distance is not zero, indicating the field error.

In yet another embodiment, when the predetermined pattern includes a series of sequential logic ones, the determining includes utilizing a state of the plurality of states having the series of sequential logic ones as the predetermined state; and determining whether the state of the plurality of states having the series of sequential logic ones has a minimum path metric distance with respect to path metric distances of other states of the plurality of states to provide a favorable comparison of the path metric distance with the excepted path metric distance. In a further embodiment, when the predetermined pattern includes a series of sequential logic ones, the determining includes utilizing a state of the plurality of states having the series of sequential logic ones as the predetermined state; determining whether the path metric distance is zero; and when the path metric distance is not zero, indicating the field error.

The process then proceeds to Step 74 where the path metric distance is compared with em expected path metric distance for the predetermined state. The process then proceeds to Step 76 where determination is made as to whether the comparison was favorable. If not, the process proceeds to Step 78 where a field error is indicated. If the comparison at Step 76 was favorable, the process proceeds to Step 80 where a valid field is indicated. The methods of FIGS. 2 and 3 may be further illustrated with reference to the examples provided via FIGS. 4-11.

Figures 4, 5:
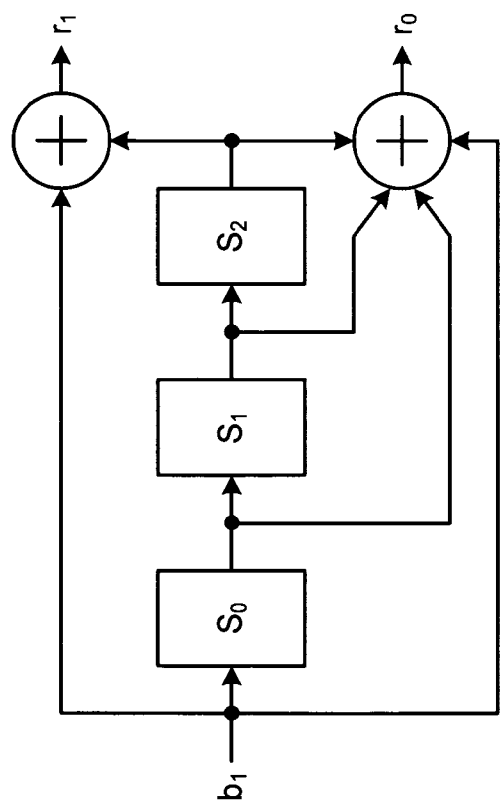
FIG. 4 is an example of a half code rate encoder in accordance with the present invention.
FIG. 5 is a table illustrating the encoding states of the example encoder of FIG. 4.

FIG. 4 is a schematic block diagram of an example ½ code rate encoder that encodes a single bit into two bits. In this example, the encoder includes three states. In the decoding module 22 of the radio receiver 10, the decoder may function to decode two or more states. The half code rate encoder encodes the input bit ($b_1$) into output bits ($r_0, r_1$). This is done by modulo 2 adding the input bit with a $1^{st}$, $2^{nd}$ and $3^{rd}$ delay states of the input bit via a modulo 2 adder, which may be implemented as an exclusive OR gate, to produce the output bit $r_0$. The input bit is summed with the output of the $3^{rd}$ state ($S_2$) to produce the output bit $r_1$.

The table of FIG. 5 illustrates the encoding performed by the example encoder of FIG. 4. As shown, with input bit $b_1$ in a corresponding current state of $S_0$, $S_1$, and $S_2$, the next state and output bits are defined.

Figures 6, 7:
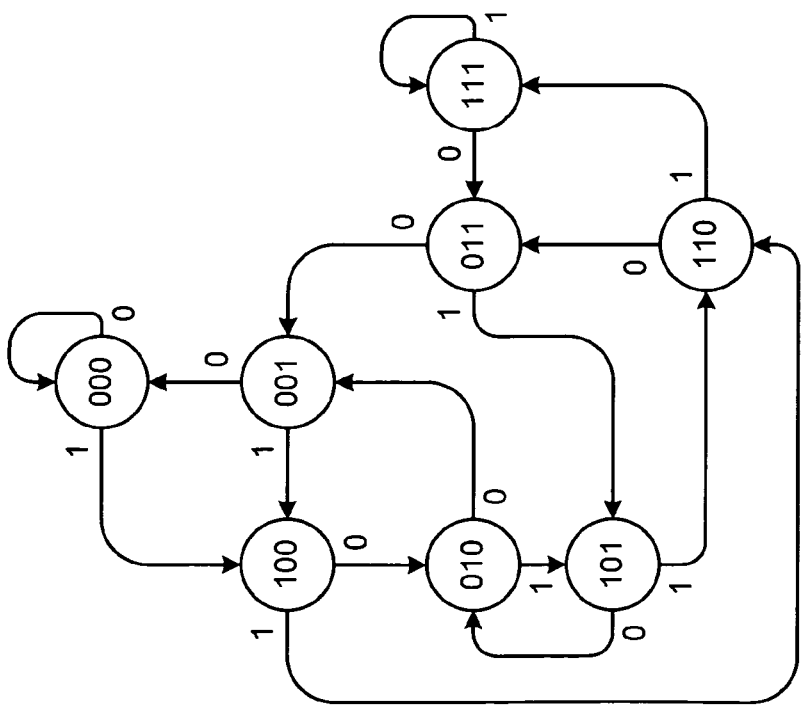
FIG. 6 is a state diagram of encoding performed by the example encoder of FIG. 4.
FIG. 7 is a table illustrating an example of encoding a digital bit stream in accordance with the present invention.

FIG. 6 illustrates a state diagram of the encoding performed by the example encoder of FIG. 4. At state 000, with an input bit of 0, the next state remains at state 0000. At state 000, if the input bit is 1, the next state is 100. Each state (e.g., 000 through 111) points to a next state based on the corresponding input bit $b_1$.

FIG. 7 illustrates an example of encoding an input bit stream of 10110011110000. The encoding occurs over 15 time intervals where at time interval $t_0$ the current state is initialized to 000. At time $t_1$, the $1^{st}$ input bit of logic 1 is received, with the current state of 000, the next state is 100 and the output is 11. At time $t_2$, the input bit is logic 0 producing a next state of 001 and an output of 10. The process continues on a bit-by-bit basis per time interval until the entire example bit stream is encoded as shown.

Figure 8:
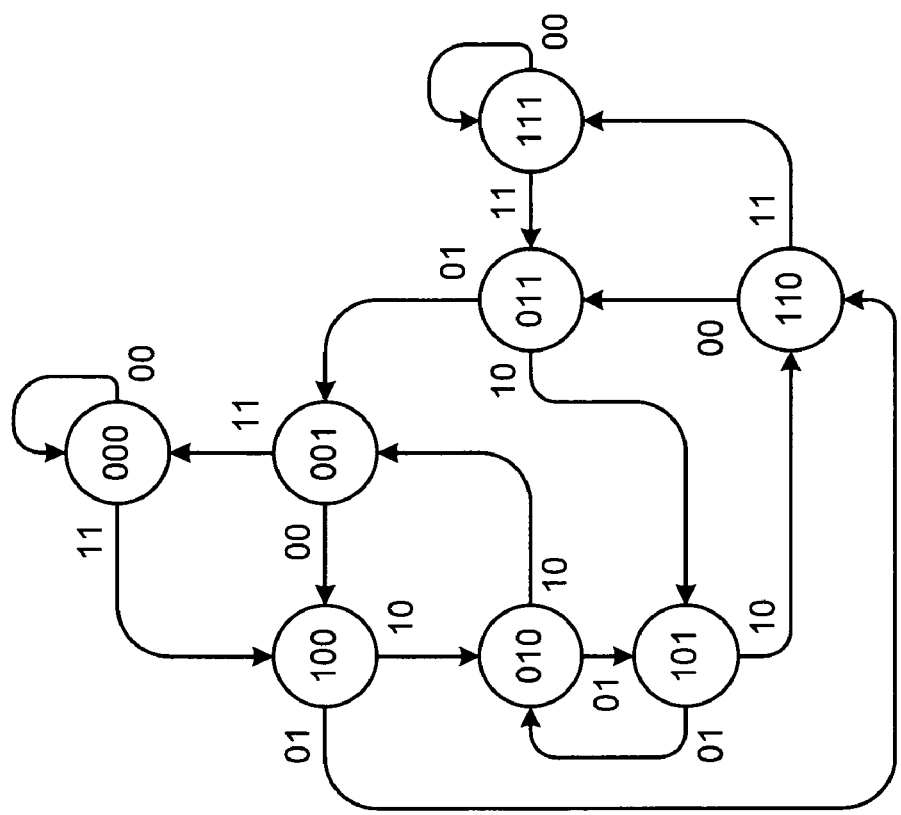
FIG. 8 is a state diagram of decoding a bit stream encoded by the example encoder of FIG. 4.

FIG. 8 illustrates a state diagram of decoding based on the current state and the received output bits. For each state 000 through 111, the current state points to the next state based on the corresponding received output bits. For example, if the current state is 001 and the received output bits are 00, the next state is 100. If, at state 001, the received bits are 11, the next state is 000. The remaining links between current and next states are as shown.

Figure 9:
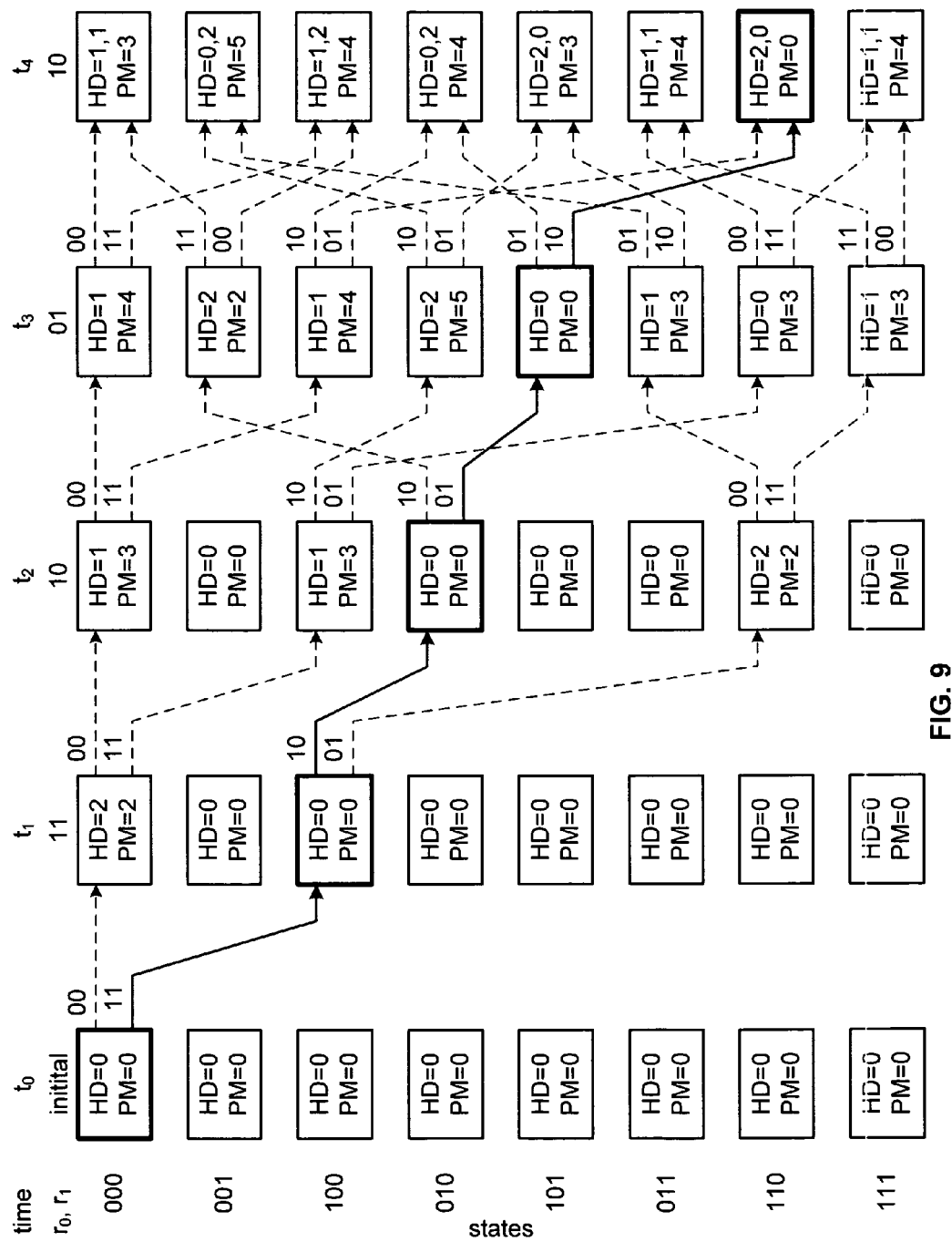
FIGS. 9-11 illustrate an example of decoding the example of FIG. 7.
Figure 10:
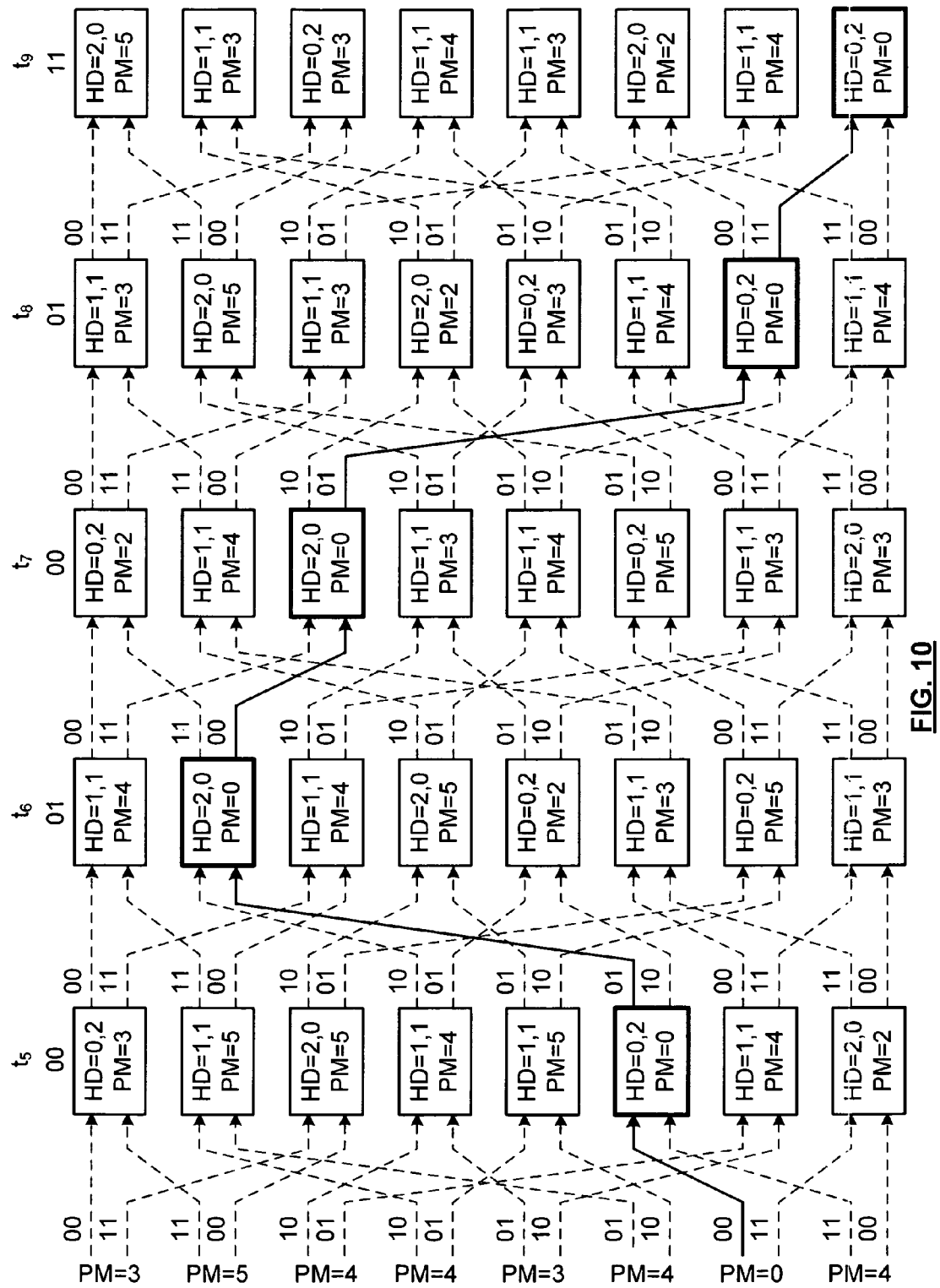
Figure 11:
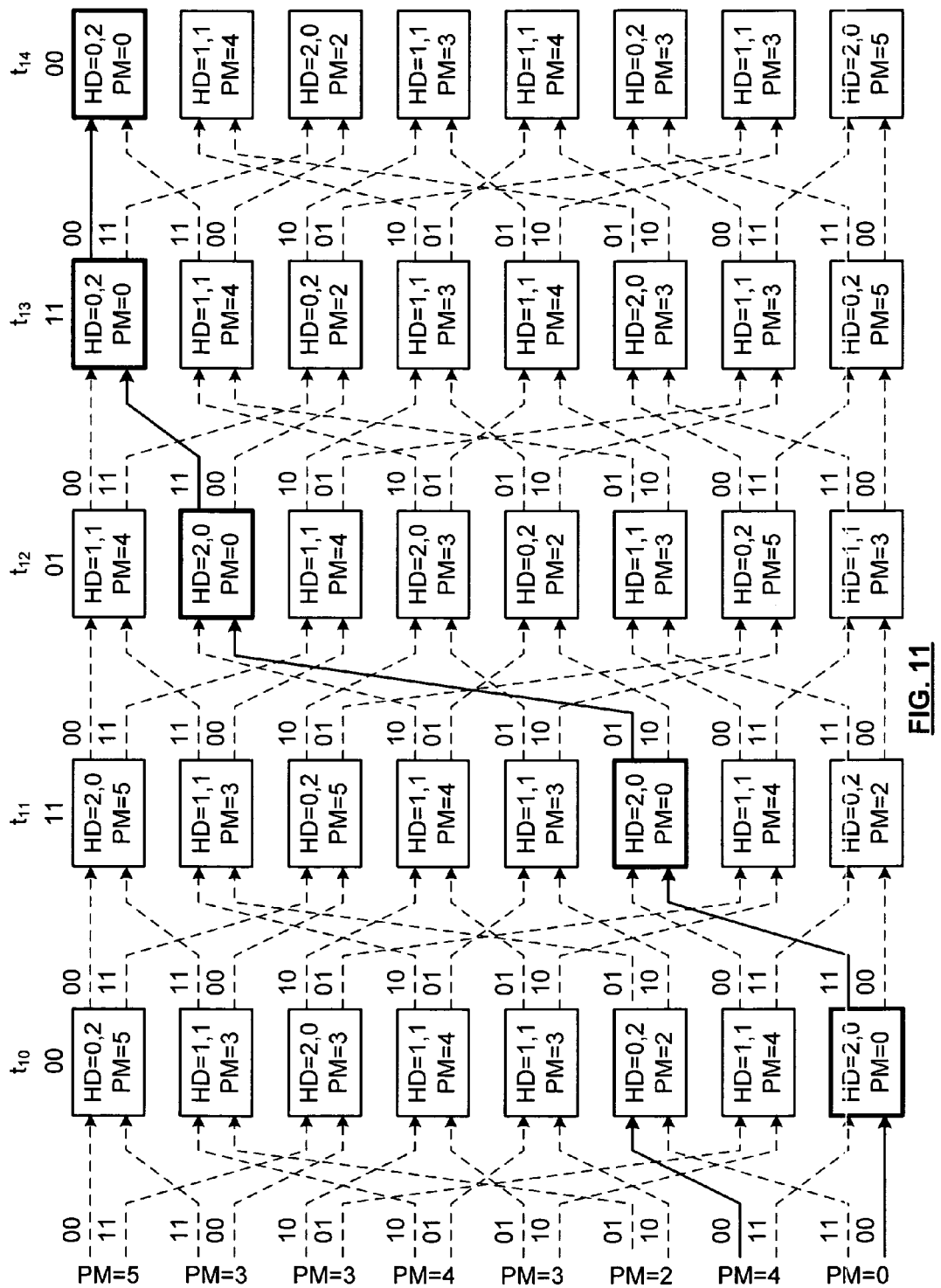

FIGS. 9-11 illustrate the decoding process of the encoded example of FIG. 7 based on the state diagram of decoding of FIG. 8. In this example, each state has a corresponding register that stores a current hamming distance (HD) and a current path metric (PM). At time $t_0$ each state hamming distance and path metric register is set to zero. In a VERTIBI decoding, the hamming distance is calculated by determining the number of bits that differ between the output bits received and the output bits associated with transitioning from a current state to the next state. The path metric value equals the lower of each branches current path metric plus the current hemming distance.

In this example, as is typical in VERTIBI decoding, the process starts at a known state. In this example, the known state is 000. In accordance with the encoded signal, at time $t_1$ the output bits of 11 are received. Since the initial state is known to be at 000 the next states can only be 000 or 100. The next state of 000 is followed if the received encoded bits are 00 and the next state is 100 if the received encoded bits are 11. To determine which path is followed, the state having the lowest path metric is selected as the appropriate next state. As shown, the hamming distance for state 000 at time $t_1$ is calculated to be 2, which indicates the number of bits that differ between the received encoded bits of 11 and the bits 00 that cause a transition from a current state of 000 to a next state of 000. As is also shown, the path metric for state 000 at time $t_1$ is calculated as the accumulated path metric, which was 0 at time $t_0$ plus the current hamming distance which is 2 resulting in a current path metric value of 2.

At state 100, the hamming distance and path metrics are also calculated. In this instance, the hamming distance is 0 since the bit patterns of what was received and what was needed to transfer from state 000 to 100 are the same. Since the previous path metric was 0 and the hamming distance is currently 0, the accumulated path metric is 0.

At time $t_2$, the encoded bits of 10 are received. The possible transitions from time $t_1$ to time $t_2$ are shown by the dashed lines and one solid line. The one solid line corresponds with the proper decoding of the received bits. In this example, the hamming distance and path metric for each possible next state is calculated where the actual next state is the state having the lowest path metrics. As shown, the hamming distance at time $t_2$ for state 000 is 1 and the updated path metric is 3, which is the sum of the previous path metric of 2 with the current hamming distance of 1. The hamming distance at state 100 is 1 and the path metric is updated to be 3, which corresponds to the previous path metric of 2 at state 000 and the current hamming distance of 1. The hamming distance at state 010 is 0 since the received encoded bits matches the encoded bits needed to transfer from state 100 to state 010. The path metric is the sum of the previous path metric which was 0 with the current hamming distance which was 0. The hamming distance at state 110 is 2 and the path metric at this state is also 2. Since the state 010 has the lowest path metric this is the appropriate next state giving the previous state of 100 and the received encoded bits of 10.

At time $t_3$, the hamming distance and path metric are updated for each state. In this instance, each state at $t_3$ may only be achieved by one path of a previous state. As shown, the hamming distance for state 000 is 1 since the path to achieve a next state of 000 is only possible from a previous state of 000 with encoding bits of 00. In this instance, the received encoding bits were 01 hence a hamming distance of 1. The previous path metric was 3 at state 000, thus the current path metric at state 000 is 4.

At state 001, the hamming distance is determined to be 2 since the received bits are 01 and the needed encoded bits to transfer from state 010 to state 001 are 10. Since the previous path metric at state 1010 was 0 and the current hamming distance is 2, the current path metric at state 001 is 2. The path metric and hamming distance is calculated for each of the states. As shown, at state 101, the hamming distance is 0 and the path metric is 0. Thus, for time $t_3$ and receiving bits of 01, the proper state is 101.

At time $t_4$ each of the states may be reached from two different previous states. As shown, state 000 may be the next state for previous state 000 or previous state 001. In this instance, the hamming distance is calculated for each path to the current state and the path metric is calculated for each path and the lower of the two path metrics is selected as the current path metric. For example, at state 000, the path from previous state 000 to a current state of 000 is achieved if the received bits are 00. In this instance, the received bits are 10. Thus, the hamming distance for this path is 1. The path metric for this path is the previous path metric of 4 plus the current hamming distance of 1 which equals 5. The $2^{nd}$ path from a previous state of 001 to a current state of 000 is achieved if the received encoded bits are 11. Since the received bits are 10, the hamming distance for this path is 1. The previous path metric for this path was 2, thus the current path metric for this path is 3. Since 3 is less than 5, the current path metric for state 000 is 3.

The hamming distance and path metric are calculated for each state in a similar fashion. As shown, the path metric for state 110 is 0 indicating that this is the proper next state when bits 10 are received at time $t_4$. The example continues with reference to FIGS. 10 and 11 where, for each time interval, the corresponding encoded bits are received and the hamming distance and path metrics are determined. For instance, at time $t_5$ state 010 is the proper next state, at time $t_6$ the proper next state is 001, at time $t_7$ the next state is 100, at $t_8$ the next state is 110 and at time $t_9$ the next state is 111. At time $t_{10}$, the next state is 111, at time $t_{11}$ the next state is 011, at time $t_{12}$ the next state is 001 and at times $t_{13}$ and $t_{14}$ the next state is 000.

As shown, with the bit pattern having a series of four 1's followed by a series of four 0's, the series of four 1's have the decoding converged to the state including all 1's, thus, if proper decoding is occurring one can readily look at the path metric at a known time interval for a corresponding known bit pattern and determine that the bit pattern is properly being decoded. This similarly occurs when the four consecutive 0's are being decoded where the decoding converges to state 000.

Once each decoded state has been identified, the encoded bit pattern can be recovered based on the state diagram of FIG. 8. Accordingly, the decoded bits are as shown in the table below.

| Time | State | Decoded bit |
| --- | --- | --- |
| 0 | 000 | X |
| 1 | 100 | 1 |
| 2 | 010 | 0 |
| 3 | 101 | 1 |
| 4 | 110 | 1 |
| 5 | 011 | 0 |
| 6 | 001 | 0 |
| 7 | 100 | 1 |
| 8 | 110 | 1 |
| 9 | 111 | 1 |
| 10 | 111 | 1 |
| 11 | 011 | 0 |
| 12 | 001 | 0 |
| 13 | 000 | 0 |
| 14 | 000 | 0 |

From the example of FIGS. 4-11, the valid decoding of any known bit pattern can be ascertained since that, at any given time, the known state can be determined based on the path metric. If the decoding is at the known state for the corresponding time, the decoding is proceeding properly. If the decoding at a particular time is not at the appropriate state, the decoding is not proceeding properly and an indication thereto may be generated.

The preceding discussion has presented a method and apparatus for utilizing decoding to indicate the validity of such decoding. As one of ordinary skill in the art will appreciate, other embodiments may be derived from the teaching of the present invention without deviating from the scope of the claims.

What is claimed is:

1. A method for signal field error checking, the method comprises:
   decoding a predetermined tail bit pattern of a signal field to produce a decoded tail bit pattern;
   determining, for the decoded tail bit pattern, a state having a desired path metric distance;
   determining whether the state having the desired path metric distance substantially corresponds to an expected state, wherein the expected state is based on the predetermined tail bit pattern; and
   when the state having the desired path metric distance does not substantially correspond to the expected state, indicating a signal field error.

2. The method of claim 1 further comprises:
   when the state having the desired path metric distance substantially corresponds to the expected state, indicating a valid signal field.

3. The method of claim 1 comprises, when the predetermined tail bit pattern includes a series of sequential logic zeros:
   identifying one of a plurality of states of the decoding having a minimal path metric distance as the state having the desired path metric distance, wherein the expected stated corresponds to an initial state of the plurality of states.

4. The method of claim 1 comprises, when the predetermined tail bit pattern includes a series of sequential logic ones:
   identifying one of a plurality of states of the decoding having a minimal path metric distance as the state having the desired path metric distance, wherein the expected stated corresponds to a state of the plurality of states having the series of sequential logic ones.

5. The method of claim 1, wherein the decoding comprises at least one of:
   Viterbi decoding;
   trellis decoding; and
   convolutional decoding.

6. A method for field error checking, the method comprises:
   decoding a predetermined pattern of a field of a frame to produce a decoded pattern;
   determining, for the decoded pattern, a path metric distance of a predetermined state of a plurality of states of the decoding;
   comparing the path metric distance with an excepted path metric distance for the predetermined state; and
   when the path metric distance compares unfavorably with the excepted path metric distance, indicating a field eror.

7. The method of claim 6 further comprises:
   when the path metric distance compares unfavorably with the excepted path metric distance, indicating a valid field.

8. The method of claim 6 further comprises, when the predetermined pattern includes a series of sequential logic zeros:
   utilizing an initial state of the plurality of states as the predetermined state; and
   determining whether the initial state has a minimum path metric distance with respect to path metric distances of other states of the plurality of states to provide a favorable comparison of the path metric distance with the excepted path metric distance.

9. The method of claim 6 further comprises, when the predetermined pattern includes a series of sequential logic zeros:
   utilizing an initial state of the plurality of states as the predetermined state;
   determining whether the path metric distance is zero; and
   when the path metric distance is not zero, indicating the field error.

10. The method of claim 6 further comprises, when the predetermined pattern includes a series of sequential logic ones:
    utilizing a state of the plurality of states having the series of sequential logic ones as the predetermined state; and
    determining whether the state of the plurality of states having the series of sequential logic ones has a minimum path metric distance with respect to path metric distances of other states of the plurality of states to provide a favorable comparison of the path metric distance with the excepted path metric distance.

11. The method of claim 6 further comprises, when the predetermined pattern includes a series of sequential logic ones:
    utilizing a state of the plurality of states having the series of sequential logic ones as the predetermined state;
    determining whether the path metric distance is zero; and
    when the path metric distance is not zero, indicating the field error.

12. An apparatus comprises:
    domain conversion module operably coupled to convert time domain signals into frequency domain symbols;
    demapping module operably coupled to convert the frequency domain symbols into interleaved data;
    deinterleaving module operably coupled to deinterleave the interleaved data to produce encoded data; and
    a decoding module operably coupled to decode the encoded data to produce data, wherein the decoding module further functions to:
      decode a predetermined tail bit pattern of a signal field to produce a decoded tail bit pattern;
      determine, for the decoded tail bit pattern, a state having a desired path metric distance;
      determine whether the state having the desired path metric distance substantially corresponds to an expected state, wherein the expected state is based on the predetermined tail bit pattern; and
      when the state having the desired path metric distance does not substantially correspond to the expected state, indicate a signal field error.

13. The apparatus of claim 12, wherein the decoding module further functions to:
    when the state having the desired path metric distance substantially corresponds to the expected state, indicate a valid signal field.

14. The apparatus of claim 12, wherein the decoding module further functions to, when the predetermined tail bit pattern includes a series of sequential logic zeros:
    identify one of a plurality of states of the decoding having a minimal path metric distance as the state having the desired path metric distance, wherein the expected stated corresponds to an initial state of the plurality of states.

15. The apparatus of claim 12, wherein the decoding module further functions to, when the predetermined tail bit pattern includes a series of sequential logic ones:
identify one of a plurality of states of the decoding having a minimal path metric distance as the state having the desired path metric distance, wherein the expected stated corresponds to a state of the plurality of states having the series of sequential logic ones.

16. The apparatus of claim 12, wherein the decoding module further functions to decode the encoded data by at least one of:
Viterbi decoding;
trellis decoding; and
convolutional decoding.

17. An apparatus comprises:
domain conversion module operably coupled to convert time domain signals into frequency domain symbols;
demapping module operably coupled to convert the frequency domain symbols into interleaved data;
deinterleaving module operably coupled to deinterleave the interleaved data to produce encoded data; and
a decoding module operably coupled to decode the encoded data to produce data, wherein the decoding module further functions to:
decode a predetermined pattern of a field of a frame to produce a decoded pattern;
determine, for the decoded pattern, a path metric distance of a predetermined state of a plurality of states of the decoding;
compare the path metric distance with an excepted path metric distance for the predetermined state; and
when the path metric distance compares unfavorably with the excepted path metric distance, indicate a field error.

18. The apparatus of claim 17, wherein the decoding module further functions to:
when the path metric distance compares unfavorably with the excepted path metric distance, indicate a valid field.

19. The apparatus of claim 17, wherein the decoding module further functions to, when the predetermined pattern includes a series of sequential logic zeros:
utilize an initial state of the plurality of states as the predetermined state; and
determine whether the initial state has a minimum path metric distance with respect to path metric distances of other states of the plurality of states to provide a favorable comparison of the path metric distance with the excepted path metric distance.

20. The apparatus of claim 17, wherein the decoding module further functions to, when the predetermined pattern includes a series of sequential logic zeros:
utilize an initial state of the plurality of states as the predetermined state;
determine whether the path metric distance is zero; and
when the path metric distance is not zero, indicate the field error.

21. The apparatus of claim 17, wherein the decoding module further functions to, when the predetermined pattern includes a series of sequential logic ones:
utilize a state of the plurality of states having the series of sequential logic ones as the predetermined state; and
determine whether the state of the plurality of states having the series of sequential logic ones has a minimum path metric distance with respect to path metric distances of other states of the plurality of states to provide a favorable comparison of the path metric distance with the excepted path metric distance.

22. The apparatus of claim 17, wherein the decoding module further functions to, when the predetermined pattern includes a series of sequential logic ones:
utilize a state of the plurality of states having the series of sequential logic ones as the predetermined state;
determine whether the path metric distance is zero; and
when the path metric distance is not zero, indicate the field error.

* * * * *